(12) United States Patent
Hidaka et al.

(10) Patent No.: US 6,384,450 B1
(45) Date of Patent: May 7, 2002

(54) SEMICONDUCTOR MEMORY DEVICE AND METHOD OF MANUFACTURING THE SAME

(75) Inventors: Ken-Ichi Hidaka; Masaru Tsukiji, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/304,605

(22) Filed: May 4, 1999

(30) Foreign Application Priority Data

May 13, 1998 (JP) ............................................ 10-129865

(51) Int. Cl.$^7$ ............................................ H01L 29/788
(52) U.S. Cl. ........................ 257/321; 257/315; 257/316; 257/317; 257/318; 257/319; 257/320; 257/322; 257/323; 257/382; 257/383; 438/201; 438/211; 438/257; 438/260; 438/262; 438/264; 438/266
(58) Field of Search ................................. 257/382, 383, 257/315–323; 438/300, 201, 211, 257, 260, 261, 262, 263, 264, 266

(56) References Cited

U.S. PATENT DOCUMENTS

| | | | |
|---|---|---|---|
| 4,849,369 A | * | 7/1989 | Jeuch et al. .................. 437/43 |
| 5,053,840 A | * | 10/1991 | Yoshikawa ................. 357/23.5 |
| 5,430,327 A | * | 7/1995 | Wu et al. .................... 257/745 |
| 5,635,415 A | * | 6/1997 | Hong ......................... 438/261 |
| 5,736,419 A | * | 4/1998 | Naem ......................... 437/44 |
| 6,033,956 A | * | 3/2000 | Wu ............................. 438/261 |
| 6,215,147 B1 | * | 4/2001 | Hong ......................... 257/315 |

FOREIGN PATENT DOCUMENTS

| | | |
|---|---|---|
| JP | 61-30063 | 2/1986 |
| JP | 07-135260 | 5/1995 |
| JP | 9-55442 | 2/1997 |

* cited by examiner

Primary Examiner—Tom Thomas
Assistant Examiner—Donghee Kang
(74) Attorney, Agent, or Firm—Scully, Scott, Murphy & Presser (57) ABSTRACT

In a semiconductor memory device, such as a flash memory device, a conductor layer of metal or metal compound having high refractoriness, such as titanium nitride, is formed on a conductor or wiring formed by a buried diffusion layer to reduce resistance thereof. In the present invention, such conductor layer is formed by using small number of process steps and without using photolithography process. For example, after forming the buried diffusion layer for source and drain regions by ion implantation using each floating gate and dummy gate as a mask, titanium nitride is deposited throughout a substrate. Thereafter, by using oxide film growth and etching back process, an oxide film layer remaining on the titanium nitride layer between the floating gate and the dummy gate is fabricated. Then, the titanium nitride layer on the floating gate and on the dummy gate is removed by using this remained oxide film layer as a mask, without using any photolithography process.

15 Claims, 6 Drawing Sheets

PRIOR ART

PRIOR ART

SEMICONDUCTOR MEMORY DEVICE AND METHOD OF MANUFACTURING THE SAME

FIELD OF THE INVENTION

The present invention relates generally to a semiconductor memory device and a method of manufacturing the semiconductor memory device. More particularly, the present invention relates to a semiconductor memory device in which resistance of source or drain diffusion layer can be effectively reduced and size of each memory cell can be reduced, and a method of manufacturing such memory device wherein number of process steps can be decreased to simplify manufacturing process of the memory device.

BACKGROUND OF THE INVENTION

In order to reduce resistance of a diffusion layer of a bit line or a source line of a semiconductor memory device, such as a flash memory device, there is known a method in which a metal layer is formed on the diffusion layer. Especially, with respect to the flash memory device having conductors or wirings each composed of a buried diffusion layer, three methods are considered to form the metal layer on the conductors. In the first method, a metal layer or a metal compound layer is formed on whole surface of a substrate, and thereafter unnecessary portions of the metal layer or the metal compound layer are removed by using a photolithography process and an etching process. In the second method, by using a salicidation (self-aligned silicidation), a titanium layer contacting a silicon layer or substrate is silicided to form titanium silicide layer. In the third method, a tungsten layer, for example, is grown as the metal layer, by using selective CVD.

However, when the salicidation of titanium is used as in the second method, there is a problem that titanium coagulates or coheres in the titanium silicide layer when oxidation is performed thereafter. Also, in the third method, when selective growth of tungsten is used, it is necessary to form a barrier metal layer between the conductors composed of the buried diffusion layer and the tungsten layer and to process the barrier metal layer by using process steps similar to those used in the first method. Therefore, conventionally, the first method had to be used to form the metal layer on the buried diffusion layer.

Figure 5A:
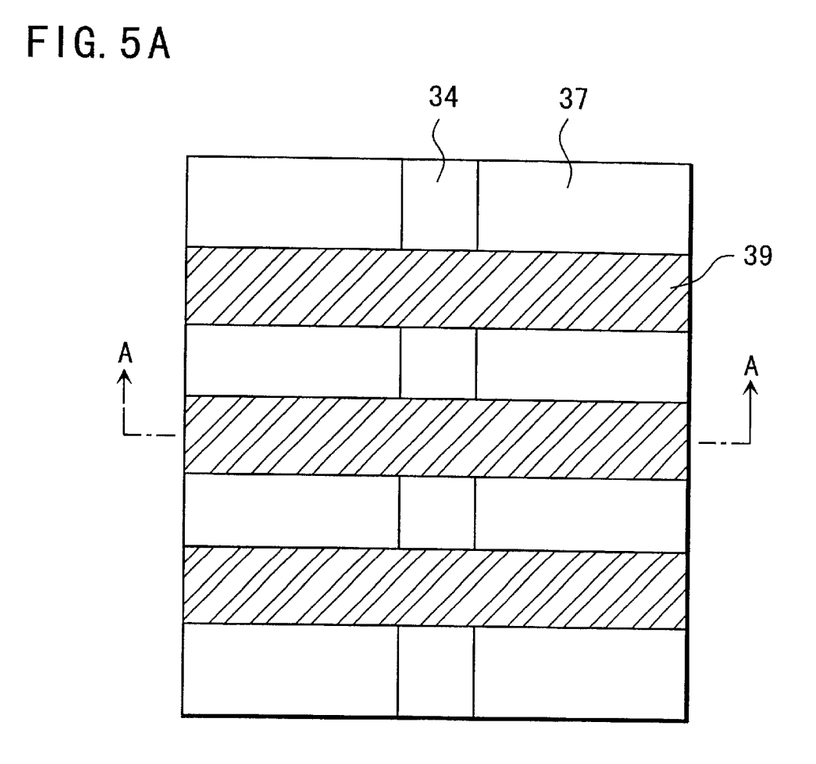
FIG. 5A is a partial plan view illustrating a structure of a conventional semiconductor memory device.
Figure 5B:
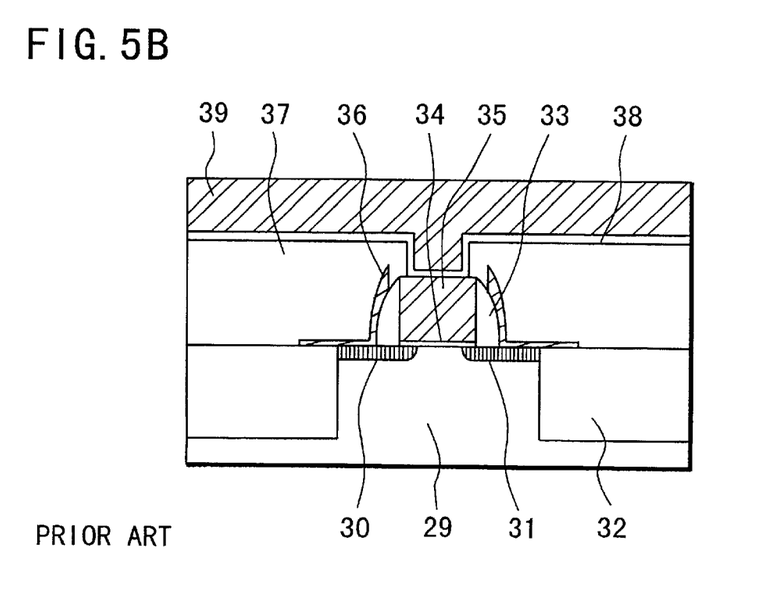
FIG. 5B is a partial cross sectional view, taken along the line A—A of FIG. 5A, illustrating the conventional semiconductor memory device.

FIGS. 5A and 5B illustrates a structure of a flash memory device fabricated by using a prior art method, that is, the first method mentioned above. FIG. 5A is a plan view of the flash memory device, and FIG. 5B is a cross sectional view taken along the line A—A of FIG. 5A.

As shown in FIG. 5A, a plurality of control gate conductors 39 which also constitute word lines are disposed in a lateral direction in the drawing. Under the control gate conductors 39, a source region 30 and a drain region 31 each made of a buried diffusion layer are formed in a vertical direction via an interlayer oxide film 37 and so on. The drain region 31 also functions as a bit line.

As shown in FIG. 5B, on a channel region between the source region 30 and the drain region 31, a tunnel oxide film 34, a floating gate 35, an ONO film (oxide film-nitride film-oxide film) 38, and the control gate 39 are formed sequentially from the bottom. In order to reduce the resistance of each of the conductors of the buried diffusion layer, a titanium nitride layer 36 is formed as a metal layer or a metallic compound layer on the surface of each of the source region 30 and the drain region 31. On the side surfaces of the floating gate 35, oxide film sidewall spacers 33 are formed and isolate the floating gate 35 and the titanium nitride layer 36 from each other. The titanium nitride layer 36 also extends from the surface of each of the source region 30 and the drain region 31 along the side surface of the sidewall spacers 33.

With reference to FIGS. 6A through 6D, explanation will be made on a method of manufacturing the conventional flash memory device shown in FIGS. 5A and 5B.

Figure 6A:
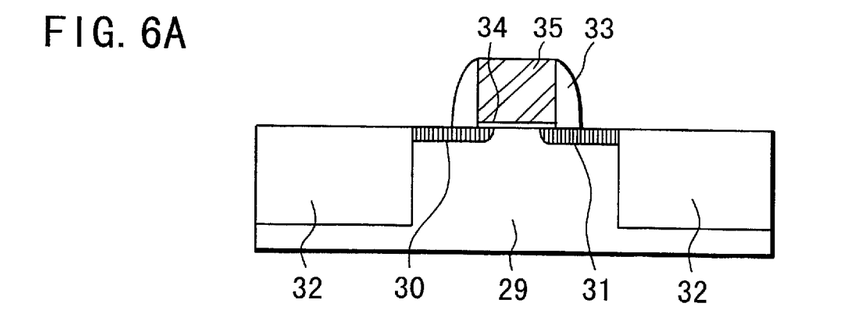
FIGS. 6A through 6D are partial cross sectional views illustrating a process of fabricating a semiconductor memory device shown in FIGS. 5A and 5B.

First, as shown in FIG. 6A, a semiconductor substrate 29 in which element isolation regions 32 having a structure such as STI (Shallow Trench Isolation) and a tunnel oxide film 34 are formed is prepared. On the semiconductor substrate 29, a polycrystalline silicon (polysilicon) layer is formed by using, for example, CVD (Chemical Vapor Deposition). The polysilicon layer is patterned by using a photolithography process such that a floating gate 35 made of polysilicon is disposed in the direction of the bit line. Further, a silicon oxide film is formed on whole surface of the semiconductor substrate and the silicon oxide film is etched back by anisotropic etching, so that oxide film sidewall spacers 33 are formed on the side surface of the floating gate 35. Thereafter, buried diffusion layers of the source 30 and the drain 31 are formed by ion implantation.

Figure 6B:
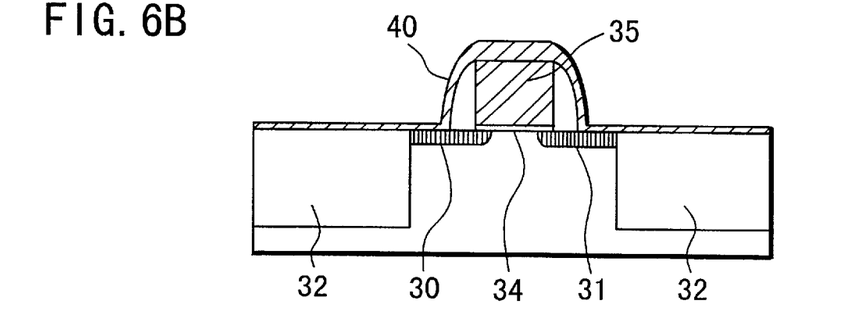

Then, as shown in FIG. 6B, high refractory metal or metal compound, for example, titanium nitride in this case, is sputtered on whole surface of the semiconductor substrate to form a titanium nitride layer 40.

Figure 6C:
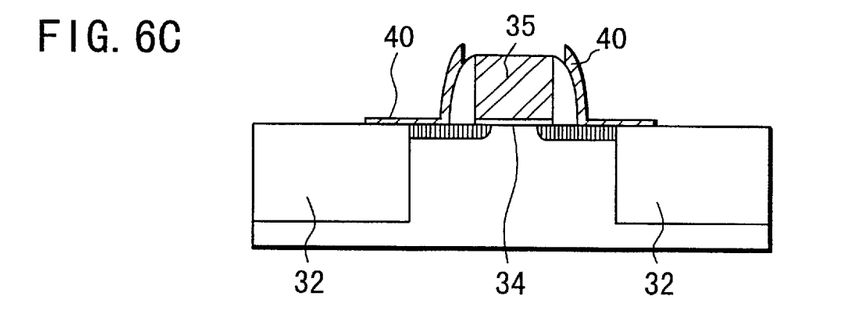

Further, as shown in FIG. 6C, the titanium nitride layer 40 is patterned by using a photolithography process and an etching process such that portions of the titanium nitride layer 40 on the floating gate 35 and on the element isolation region 32 are removed. In this case, as shown in FIG. 6C, it is required that both ends of each of the remained titanium nitride layers 40 are on the oxide film sidewall spacer 33 and on the element isolating region 32. If the titanium nitride layer 40 is patterned such that end portions of the remained titanium nitride layer 40 are on the diffusion layers 30 and 31, the semiconductor substrate 29 including the diffusion layers 30 and 31 is exposed and over-etched by the etching process of patterning the titanium nitride layer 40.

Figure 6D:
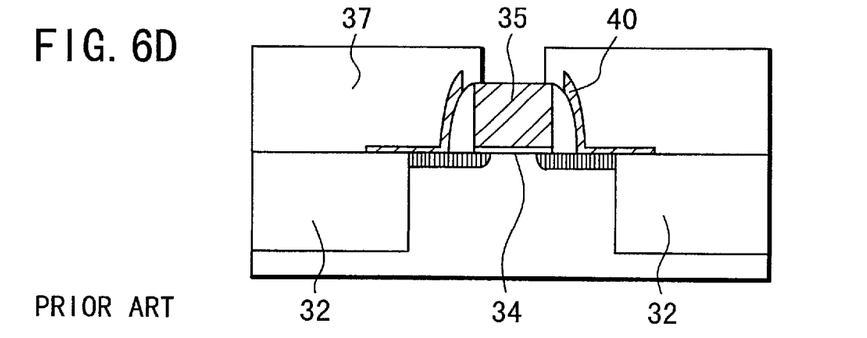

As shown in FIG. 6D, an oxide film is then grown on whole surface of the semiconductor substrate by using, for example, CVD, and this oxide film is etched back to form an interlayer oxide film 37, such that the titanium nitride layers 40 are buried under the interlayer oxide film 37. Thereafter, portion of the oxide film on the floating gate 35 is selectively removed by using a photolithography process and an etching process.

Then, the ONO film 38 and a tungstenpolyside layer for forming a control gate 39 are grown on whole surface of the substrate. Thereafter, patterning of the control gate 39, the ONO film 38 and the floating gate 35 is performed by using a photolithography process and an etching process, and a semiconductor memory device having a configuration shown in FIGS. 5A and 5B is obtained.

The prior art technique described above has the following problems.

In the first problem, when a metal layer such as a titanium nitride layer 36 is formed, a photolithography process is required which adds to the number of process steps to fabricate a memory device. Since the metal layer is selectively formed on the buried diffusion layer, the photolithography process is required.

In the second problem, when a portion of the interlayer oxide film on each of the floating gates is removed, a photolithography process is required which adds to the number of process steps to fabricate a memory device. As shown in FIG. 6C, if each of the metal layer, such as the titanium nitride layer 40, is formed by using a photolithography process and an etching process such that an end portion of the titanium nitride layer 40 comes near the upper end of the oxide film sidewall spacer 33, the top tip portion of the titanium nitride layer 40 protrudes in a direction perpendicular to the substrate 29 from the surface of the portion near the upper end of the oxide film sidewall spacer 33 by the amount corresponding to the thickness of the titanium nitride layer 40, so that the position of the top tip portion of the titanium nitride layer 40 becomes higher than the upper surface of the floating gate 35. If, after forming the oxide film 37 on the floating gate 35, the oxide film 37 is etched back until the floating gate 35 is exposed, a portion of the titanium nitride layer 40 is also exposed. If the ONO film 38 and the control gate 39 are formed under the condition a portion of the titanium nitride layer 40 is exposed, the thickness of the ONO film 38 formed on the top tip portion of the titanium nitride layer 40 becomes thinner than that of other portions, because the top tip portion of the exposed titanium nitride layer 40 is sharp-pointed as can be seen from FIGS. 5 and 6. Therefore, the titanium nitride layer 40 closely opposes to the control gate 39 via the relatively thin portion of the ONO film 38. In such case, if a high potential voltage is applied therebetween in a write operation or in an erase operation, there is a possibility of occurrence of insulation breakdown between the titanium nitride layer 40 and the control gate 39. Also, in this case, if the ONO film 38 is formed thickly to avoid insulation breakdown between the titanium nitride layer 40 and the control gate 39, the ONO film 38 becomes too thick between the control gate 39 and the floating gate 35 and a bad influence may be given on the operation of the flash memory device. In order to expose the top surface of the floating gate 35 and to keep a portion of the oxide film 37 remained on the top tip portion of the titanium nitride layer 40, it is necessary, after etching back the oxide film 37 to a certain extent, to selectively remove only a portion of the oxide film on the floating gate 35 by using a photolithography process, as shown in FIG. 6D. Therefore, the additional photolithography process is required.

In the third problem, it is necessary to increase the width or thickness of each of the sidewall spacers and the length of the floating gate at least by the amount of error margin or registration margin relating to the photolithography process, and therefore it is necessary to increase the size of each memory cell. In other words, since the prior art technique uses photolithography processes to form the metal layer such as the titanium nitride layer 40 and to selectively remove the interlayer oxide 37 on the floating gate 35, it is necessary to reserve registration margin of the photolithography processes, and the size of each memory cell of the semiconductor memory device increases by the amount corresponding to the registration margin.

SUMMARY OF THE INVENTION

It is therefore an object of the present invention to improve the drawbacks of the prior art technique mentioned above, and to provide a novel semiconductor memory device and a novel method of manufacturing the semiconductor memory device, wherein the semiconductor memory device can be manufactured easily and precisely.

It is another object of the present invention to provide a novel semiconductor memory device and a novel method of manufacturing the semiconductor memory device, wherein manufacturing process can be simplified by decreasing the number of photolithography processes.

It is another object of the present invention to provide a novel semiconductor memory device and a novel method of manufacturing the semiconductor memory device, wherein registration margin required for the width or thickness of the oxide film sidewall spacers and the length of the floating gate can be removed by decreasing the number of photolithography processes, thereby size of each memory cell can be reduced.

According to an aspect of the present invention, there is provided a semiconductor memory device. The semiconductor memory device comprises: a semiconductor substrate, such as a silicon substrate; element isolation regions formed in said semiconductor substrate; active regions between said element isolation regions; buried diffusion layers each constituting at least a drain region or a source region; floating gates each formed on a channel region between said drain region and said source region via an insulating film; and sidewall spacers formed on side surfaces of said floating gates and made of insulating material. The semiconductor memory device further comprises: a first layer formed on said buried diffusion layers and said sidewall spacers and comprising high refractory metal or metal compound, such as titanium nitride; a second layer formed on said first layer and made of material different from that of said first layer, such as an oxide or tungsten; a third layer formed on said second layer and comprising insulating material, such as an oxide; a fourth layer formed on said floating gate and said third layer and comprising insulating material, such as an oxide or nitride; and a control gate formed on said fourth layer.

According to still another aspect of the present invention, there is provided a method of manufacturing a semiconductor memory device. The method comprises: providing a semiconductor substrate; forming element isolation regions in said semiconductor substrate and defining active regions between said element isolation regions; forming floating gates within said active regions and forming dummy floating gates on said element isolation regions; forming buried diffusion layers each constituting at least a drain region or a source region; and forming sidewall spacers made of insulating material on side surfaces of said floating gates and on side surfaces of said dummy floating gates. The method further comprises; forming a first layer comprising high refractory metal or metal compound, such as titanium nitride on the surface of said substrate; forming a second layer made of a material different from the material of said first layer on said first layer, such as an oxide or tungsten; etching back said second layer to expose portions of said first layer on said floating gate and said dummy floating gate, and leaving a portion of said second layer between said floating gate within said active region and said dummy floating gate on said element isolation region and on said first layer; and etching back said first layer by using the remained portion of said second layer as a mask to expose top surfaces of said floating gate and said dummy floating gate, and leaving a portion of said first layer between said floating gate within said active region and said dummy floating gate on said element isolation region.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

Embodiments of the present invention will now be described with reference to the attached drawings.

In the present invention, in order to reduce resistance of each conductor or wirings formed by a buried diffusion layer of a semiconductor memory device, such as a flash memory device, a conductor layer of metal or metal compound having high refractoriness, such as titanium nitride, is formed on the surface of the conductor or wiring. Such conductor layer is formed by using small number of process steps and without using photolithography process. For example, after forming the buried diffusion layer for source and drain regions by ion implantation process using each floating gate as a mask, titanium nitride is deposited throughout a substrate. Thereafter, by using oxide film growth and etching back process, an oxide film layer remaining on the titanium nitride layer between the floating gate and the dummy gate is fabricated. Then, the titanium nitride layer on the floating gate and on the dummy gate is removed by using this remained oxide film layer as a mask, without using any photolithography process.

Now, embodiments of the present invention will be described in detail.

(First Embodiment)

Figure 1A:
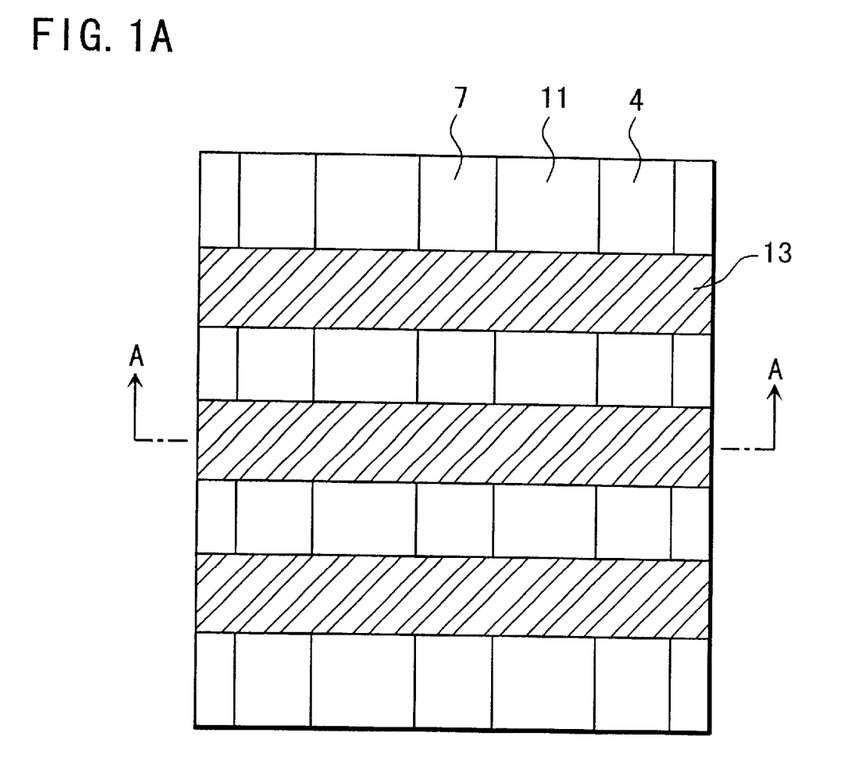
FIG. 1A is a partial plan view illustrating a structure of a semiconductor memory device according to a first embodiment of the present invention.
Figure 1B:
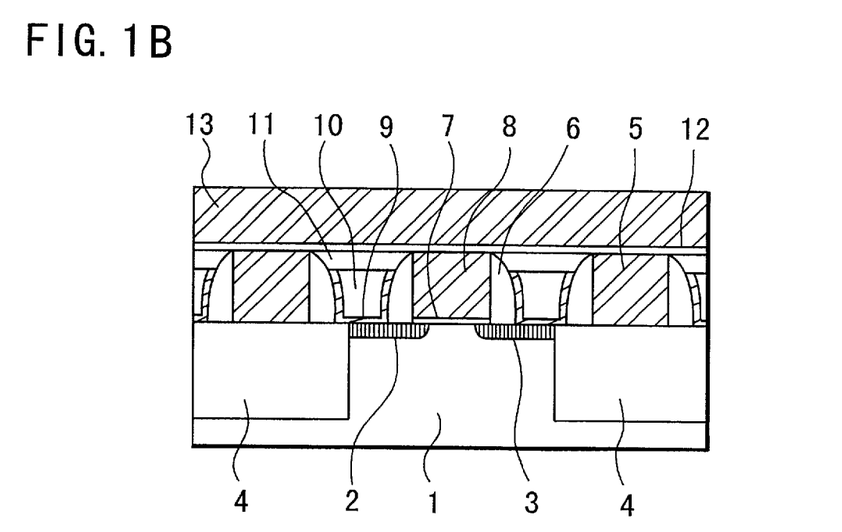
FIG. 1B is a partial cross sectional view, taken along the line A—A of FIG. 1A, illustrating the semiconductor memory device according to the first embodiment of the present invention.

FIG. 1A and FIG. 1B illustrate a structure of a part of a flash memory device as a first embodiment of the present invention. FIG. 1A is a partial plan view of the flash memory device, and FIG. 1B is a partial cross sectional view taken along the line A—A of FIG. 1A.

As shown in these drawings, on a semiconductor substrate 1, such as a silicon substrate, element isolation regions 4 are formed which define active regions. That is, the active regions exist between the element isolation regions 4 and used to form a memory cell and the like. The memory cell is a floating gate transistor in this case. The floating gate transistor comprises a source region 2 and a drain region 3 each formed of a buried diffusion layer. On a channel region between the source region 2 and the drain region 3, a tunnel oxide film 7, a floating gate 8, an ONO film (oxide film-nitride film-oxide film) 12, and the control gate conductor 13 are formed sequentially from the bottom. Also, a dummy gate or dummy floating gate 5 is formed on the element isolation region 4. The dummy gate 5 has the same structure as the floating gate 8. On the side surfaces of the floating gate 8 and the dummy gate 5, oxide film sidewall spacers 6 are formed.

In order to reduce the resistance of each of the conductors of the buried diffusion layer, a titanium nitride layer 9 is formed as a metal layer or a metallic compound layer on the surface of each of the source region 2 and the drain region 3 and along the side surface of each sidewall spacer 6. The oxide film sidewall spacers 6 isolate the floating gate 8 and the dummy gate 5 from the titanium nitride layer 9.

On the titanium nitride layer 9, there is a first interlayer oxide film 10 and a second interlayer oxide film 11 formed on the first interlayer oxide film 10. These first and second interlayer oxide films 10 and 11 isolate between the control gate 13 and the titanium nitride layer 9. The ONO film 12 is formed over the second interlayer oxide film 11, the floating gate 8 and the dummy gate 5. On the ONO film 12, control gate conductors 13 are formed. The control gate conductors 13 also function as word lines of the semiconductor memory device.

As shown in FIG. 1A, a plurality of control gate conductors 13, i.e., word lines, are disposed in a lateral direction in the drawing. Under the control gate conductors 13, there are formed the second interlayer oxide film 11, and the source region 2 and the drain region 3 each made of the buried diffusion layer disposed in a vertical direction in the drawing. The drain region 3 also functions as a bit line.

With reference to FIGS. 2A through 2D, explanation will be made on a method of manufacturing the flash memory device shown in FIGS. 1A and 1B.

Figure 2A:
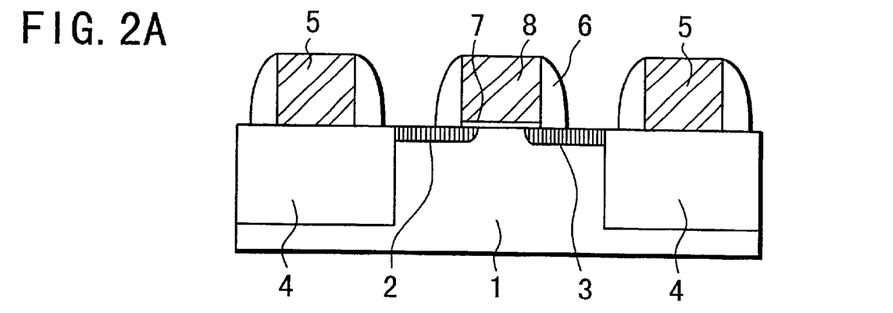
FIGS. 2A through 2D are partial cross sectional views illustrating a process of fabricating a semiconductor memory device shown in FIGS. 1A and 1B.

First, as shown in FIG. 2A, a semiconductor substrate 1 in which element isolation regions 4 having a structure such as STI (Shallow Trench Isolation) and a tunnel oxide film 7 are formed is prepared. On the semiconductor substrate 1, a polycrystalline silicon (polysilicon) layer is formed by using, for example, CVD (Chemical Vapor Deposition). The polysilicon layer is then patterned by using a photolithography process and an etching process such that floating gates 8 and dummy gates 5 made of polysilicon are respectively disposed in the direction of a bit line.

Further, a silicon oxide film is formed on whole surface of the semiconductor substrate on which the floating gates 8 and the dummy gates 5 are formed and the silicon oxide film is etched back by anisotropic etching, so that oxide film sidewall spacers 6 are formed on the side surfaces of the floating gates 8 and the dummy gates 5. Thereafter, a buried diffusion layer of the sources 2 and the drains 3 are formed by ion implantation using the floating gates 8 as a mask. In this case, it is also possible to form, before forming the oxide film sidewall spacers 6, the buried diffusion layer of the sources 2 and the drains 3 by ion implantation using the floating gates 8 as a mask.

Figure 2B:
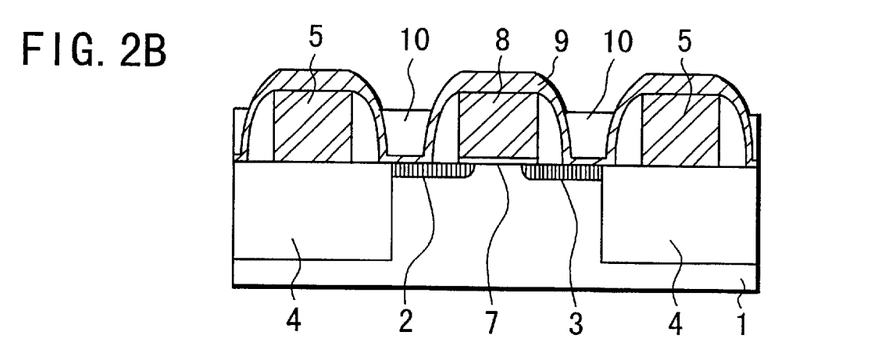

Then, as shown in FIG. 2B, high refractory metal or metal compound, for example, titanium nitride in this case, is sputtered on whole surface of the semiconductor substrate to form a titanium nitride layer 9. Then, on whole surface of the semiconductor substrate, an oxide film is grown by using, for example, CVD, which oxide film is later used for forming a first interlayer oxide film 10. Thereafter, by using a selective etching process in which etching rate of the oxide film is higher than that of the titanium nitride layer 9, the oxide film is etched back, so that the titanium nitride layer 9 on the floating gate 8 and on the dummy gate 5 is exposed and the first interlayer oxide film 10 is remained on the titanium nitride film 9 between the floating gate 8 and the dummy gate 5. In this case, it should be noted that, as shown in FIG. 2B, height of the top surface of the remained first interlayer oxide film 10 is lower than that of the top surface of the floating gate 8.

Figure 2C:
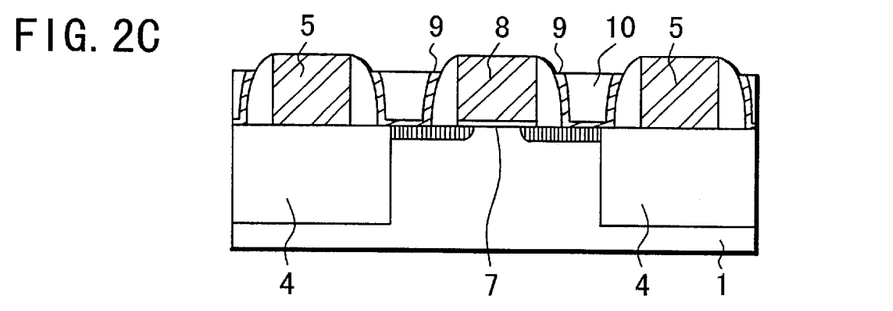

Thereafter, as shown in FIG. 2C, by using another selective etching process in which etching rate of the titanium nitride layer 9 is higher than that of the oxide film and by using the remained first interlayer oxide film 10 as a mask, the exposed titanium nitride layer 9 is etched back, so that the titanium nitride layer 9 remains only on each portion from the surface of the semiconductor substrate to a partway portion of the sidewall spacers 6. That is, the titanium nitride layer 9 remains on each of the buried diffusion layers constituting the source region 2 or the drain region 3 and on the partway or halfway portion of the sidewall spacers 6 of both the floating gate 8 and the dummy gate 5. Thereby, bit lines each comprising the buried diffusion layer and the titanium nitride layer 9 are formed. In this case, it should be noted that, as shown in FIG. 2C, height of the top portion of the remained titanium nitride layer 9 is lower than that of the top surface of the floating gate 8.

Figure 2D:
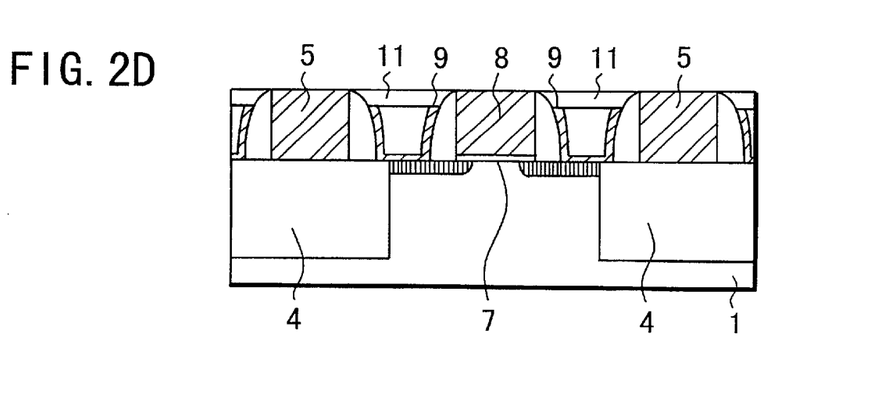

As shown in FIG. 2D, an oxide film is then grown on whole surface of the semiconductor substrate by using, for example, CVD. This oxide layer is then etched back to form a second interlayer oxide film 11 which is buried on the titanium nitride layer 9 and the first interlayer oxide film 10, such that the surfaces of the floating gate 8 and the dummy gate 5 are exposed. The second interlayer oxide film 11 contributes to insulation between the titanium nitride layer 9 and the control gate 13. It is possible to make the thickness of the second interlayer oxide film 11 thin, or it is even possible to form the ONO film 12 without forming the second interlayer oxide film 11. Since the top portions of the titanium nitride layer 9 and top surface of the first interlayer oxide film 10 form a substantially leveled flat surface, the thickness of the ONO film 12 on the top portions of the titanium nitride layer 9 does not become thinner than that of other portions thereof, even if the ONO film 12 is formed without forming the second interlayer oxide film 11. However, in order to appropriately avoid insulation breakdown between the titanium nitride layer 9 and the control gate 13 when a high potential voltage is applied therebetween, it is preferable to form the second interlayer oxide film 11 to a certain extent of thickness.

Then, the ONO film 12 and a tungstenpolyside layer for forming a control gate 13 are grown on whole surface of the substrate. Thereafter, patterning of the control gate 13, the ONO film 12, the floating gate 8 and the dummy gate 5 is performed by using a photolithography process and an etching process, and a semiconductor memory device having a configuration shown in FIGS. 1A and 1B is obtained.

In the first embodiment constituted as mentioned above, it is possible to form the metal layer or the metallic compound layer used for reducing resistance of the conductors of the buried diffusion layer without using a photolithography process. Therefore, when compared with a prior art which necessitates photolithography process for patterning the metal or metallic compound layer, it is possible to reduce the number of process steps to fabricate a semiconductor memory device. The reason why photolithography process is not required is because the structure comprising the floating gate and the dummy gate is provided on the semiconductor substrate and, by using only etching back processes, the metal or metallic compound layer can be formed on the buried diffusion layer without requiring alignment process.

Also, in the above embodiment, it is possible to form a control gate on a floating gate without using a photolithography process for selectively removing the interlayer oxide film on the floating gate. Therefore, when compared with a prior art technique in which an interlayer oxide film on the floating gate must be selectively removed by using a photolithography process, number of process required to fabricate a semiconductor memory device according to the present invention can be reduced and simplified. The reason why the photolithography process for selectively removing the interlayer oxide film on the floating gate is not required is because the height of the top portion of the metal or metallic compound layer is made lower than the height of the top surface of the floating gate by etching back process. In the semiconductor memory device according to this embodiment, the height of the top portion of the metal or metallic compound layer 9 and the height of the top surface of the first interlayer oxide film 10 are both lower than the height of the top surface of the floating gate 8. Therefore, it is possible to expose the top surface of the floating gate 8 and to bury the second interlayer oxide film 11 having enough thickness onto the metal or metalic compound layer 9 and the first interlayer oxide film 10, without using photolithography process. Even when a high potential voltage is applied to a flash memory device in a write operation or in an erase operation, the second interlayer oxide film 11 thus formed can surely avoid insulation breakdown between the metal or metallic compound layer 9 and the control gate 13.

Also, since it is not necessary to use photolithography process for isolating the metal or metallic compound layer and for forming the control gate on the floating gate, registration margin in the photolithography process is not required and the width or thickness of the sidewall spacer and the length of the floating gate can be reduced. Further, when the floating gate is formed, the dummy gate is also formed on the element isolation region. Therefore, it is possible to isolate between adjacent memory cells without using additional process therefor.

(Second Embodiment)

Figure 3A:
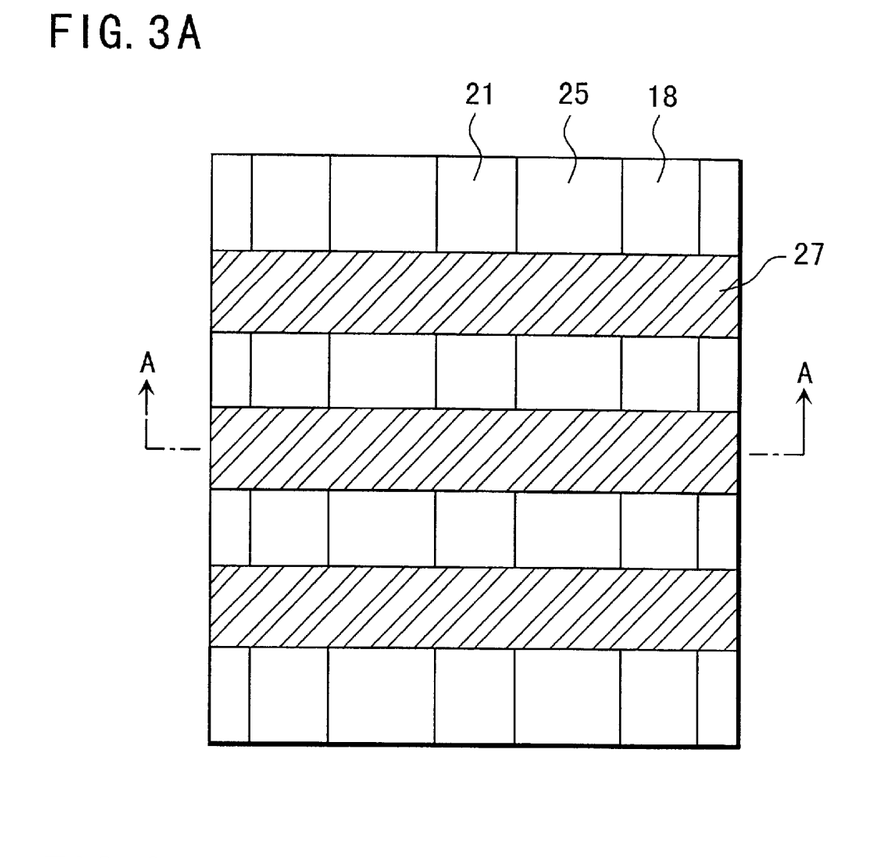
FIG. 3A is a partial plan view illustrating a structure of a semiconductor memory device according to a second embodiment of the present invention.
Figure 3B:
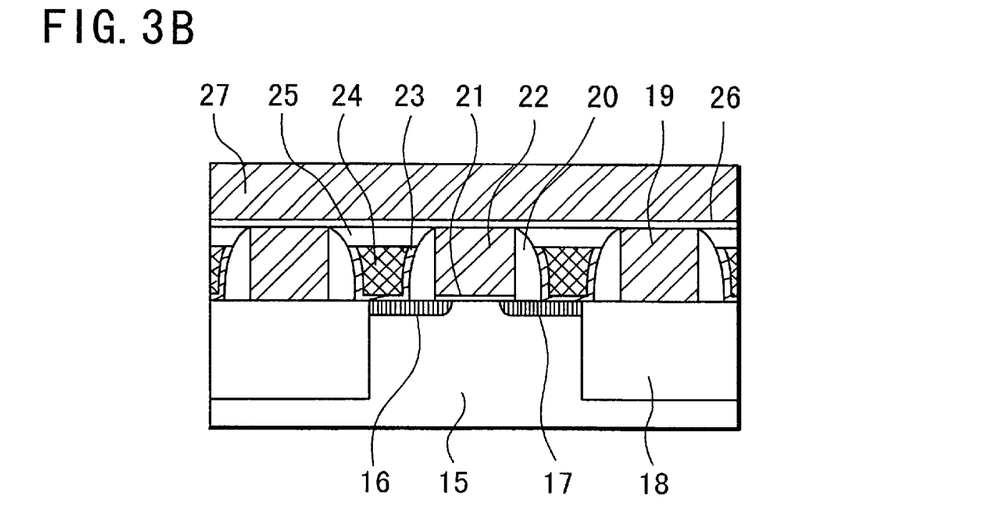
FIG. 3B is a partial cross sectional view, taken along the line A—A of FIG. 3A, illustrating the semiconductor memory device according to the second embodiment of the present invention.

FIG. 3A and FIG. 3B illustrate a structure of a part of a flash memory device as a second embodiment of the present invention. FIG. 3A is a partial plan view of the flash memory device, and FIG. 3B is a partial cross sectional view taken along the line A—A of FIG. 3A. The structure of the flash memory device according to the second embodiment is the same as that of the flash memory device according to the first embodiment, except that, as shown in FIG. 3B, the flash memory device according to the second embodiment has a tungsten layer 24 on a titanium nitride layer 23 in place of the oxide film, i.e., the first interlayer film 10 shown in FIG. 1B.

With reference to FIGS. 4A through 4D, explanation will be made on a method of manufacturing the flash memory device shown in FIGS. 3A and 3B.

Figure 4A:
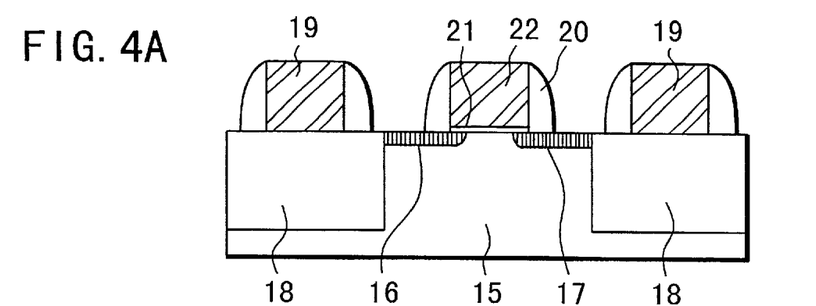
FIGS. 4A through 4D are partial cross sectional views illustrating a process of fabricating a semiconductor memory device shown in FIGS. 3A and 3B.

First, as shown in FIG. 4A, a semiconductor substrate 15 in which element isolation regions 18 having a structure such as STI and a tunnel oxide film 21 are formed is prepared. On the semiconductor substrate 15, a polycrystalline silicon (polysilicon) layer is formed by using, for example, CVD. The polysilicon layer is then patterned by using a photolithography process and an etching process such that floating gates 22 and dummy gates 19 made of polysilicon are respectively disposed in the direction of a bit line.

Further, by using the same method as that used in the first embodiment, oxide film sidewall spacers 20 are formed on the side surfaces of the floating gate 22 and the dummy gate 19. Thereafter, a buried diffusion layer of sources 16 and drains 17 are formed by ion implantation using the floating gates 22 as a mask. In this case, it is also possible to form, before forming the oxide film sidewall spacers 20, the buried diffusion layer of the sources 16 and the drains 17 by ion implantation using the floating gates 22 as a mask.

Figure 4B:
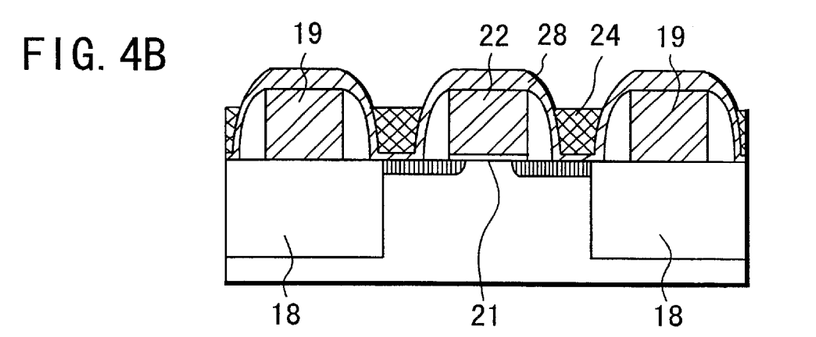

Then, as shown in FIG. 4B, high refractory metal or metal compound, for example, titanium nitride in this case, is sputtered on whole surface of the semiconductor substrate to form a titanium nitride layer 28. Then, on whole surface of the semiconductor substrate, a layer of another metal or metallic compound different from the above-mentioned metal or metallic compound, for example, tungsten in this case, is grown by using, for example, CVD to form a tungsten layer. Thereafter, by using a selective etching process in which etching rate of the tungsten is higher than that of the titanium nitride, the tungsten layer is etched back, so that the titanium nitride layer 28 on the floating gate 22 and on the dummy gate 19 is exposed and the tungsten layer 24 is remained on the titanium nitride film 28 between the floating gate 22 and the dummy gate 19. In this case, it should be noted that, as shown in FIG. 4B, height of the top surface of the remained tungsten layer 24 is lower than that of the top surface of the floating gate 22.

Figure 4C:
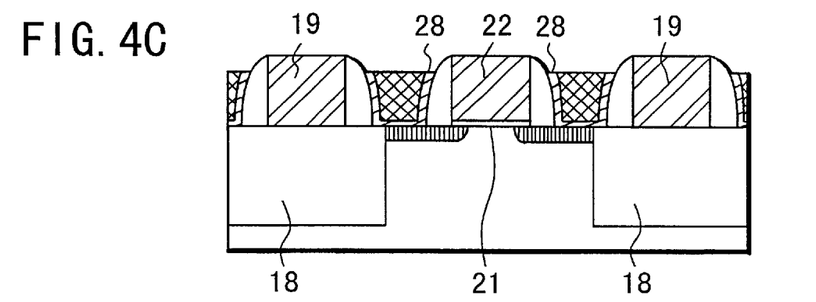

Thereafter, as shown in FIG. 4C, by using aother selective etching process in which etching rate of the titanium nitride is higher than that of the tungsten and by using the remained tungsten layer 24 as a mask, the exposed titanium nitride layer 28 is etched back, so that the titanium nitride layer 28 remains only on each portion from the surface of the semiconductor substrate to a partway portion of the sidewall spacers 20. That is, the titanium nitride layer 28 remains on each of the buried diffusion layers constituting the source region 16 or the drain region 17 and on the partway or halfway portion of the sidewall spacers 20 of both the floating gate 22 and the dummy gate 19. Thereby, bit lines each comprising the buried diffusion layer and the titanium nitride layer 28 are formed. In this case, it should be noted that, as shown in FIG. 4C, height of the top portion of the remained titanium nitride layer 28 is lower than that of the top surface of the floating gate 22.

Figure 4D:
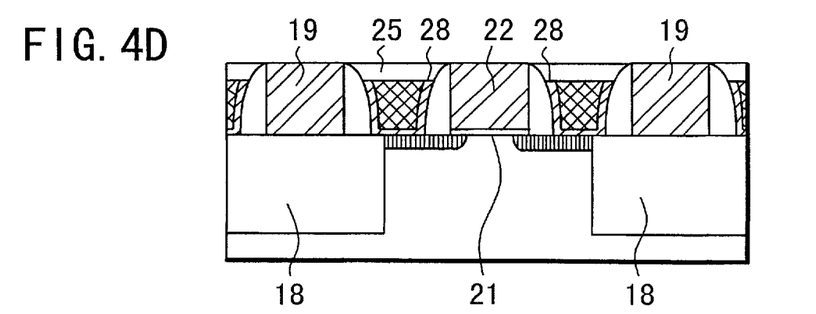

As shown in FIG. 4D, an oxide film is then grown on whole surface of the semiconductor substrate by using, for example, CVD. This oxide layer is then etched back to form an interlayer oxide film 25 which is buried on the titanium nitride layer 28 and the tungsten layer 24, such that the surfaces of the floating gate 22 and the dummy gate 19 are exposed. The interlayer oxide film 25 contributes to insulation between the titanium nitride layer 28 and the control gate 27, and between the tungsten layer 24 and the control gate 27. It is possible to make the thickness of the interlayer oxide film 25 thin, or it is even possible to form the ONO film 26 without forming the interlayer oxide film 25. Since the top portions of the titanium nitride layer 28 and top surface of the tungsten layer 24 form a substantially leveled flat surface, the thickness of the ONO film 26 on the top portions of the titanium nitride layer 28 and on the tungsten layer 24 does not become thinner than that of other portions thereof, even if the ONO film 26 is formed without forming the interlayer oxide film 25. However, in order to appropriately avoid insulation breakdown between the titanium nitride layer 28 or the tungsten layer 24 and the control gate 27 when a high potential voltage is applied therebetween, it is preferable to form the interlayer oxide film 25 to a certain extent of thickness.

Then, the ONO film 26 and a tungstenpolyside layer for forming a control gate 27 are grown on whole surface of the substrate. Thereafter, patterning of the control gate 27, the ONO film 26, the floating gate 22 and the dummy gate 19 is performed by using a photolithography process and an etching process, and a semiconductor memory device having a configuration shown in FIGS. 3A and 3B is obtained.

In the above-described semiconductor memory device and method of manufacturing the semiconductor memory device according to the second embodiment, in addition to the advantageous effects of the first embodiment, other advantageous effect is obtained wherein quantity or cross sectional area of metal or metallic compound layer on each of the buried diffusion layers increases by the amount of the tungsten layer 24, so that resistance of each bit line can be further reduced.

As apparent from the above description, according to the present invention, a metal layer or a metal compound layer for reducing resistance of each conductor of a buried diffusion layer can be fabricated without using a photolithography process, and thereby number of process steps for fabricating a semiconductor memory device can be decreased.

Also, since registration margin in the photolithography process is not required and the width or thickness of the sidewall spacer and the length of the floating gate can be reduced. Therefore, it is possible to obtain a semiconductor memory device having small cell size.

Further, each control gate can be formed on the floating gate without using a photolithography process for selectively removing an interlayer oxide film on the floating gate. Therefore, the number of process steps can be further reduced.

Also, when the floating gate is formed, the dummy gate is also formed on the element isolation region. Therefore, it is possible to isolate between adjacent memory cells without using additional process therefor.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A Semiconductor memory device comprising:

a semiconductor substrate;

element isolation regions formed in said semiconductor substrate;

active regions between said element isolation regions;

buried diffusion layers each constituting at least a drain region or a source region;

floating gates each formed on a channel region between said drain region and said source region via an insulating film;

sidewall spacers formed of side surfaces of said floating gates and made of insulating material;

a first layer formed on said buried diffusion layers and said sidewall spacers and comprising high refractory metal or metal compound, wherein said first layer does not extend vertically beyond the top surface of the floating gate;

a second layer formed on said first layer and made of material different from that of said first layer;

a third layer formed on said second layer and comprising insulating material;

a fourth layer formed on said floating gate and said third layer and comprising insulating material; and a control gate formed on said fourth layer.

2. A semiconductor memory device as set forth in claim 1, wherein said buried diffusion layer constituting a drain region also constitutes a bit line, said buried diffusion layer constituting a source region also constitutes a source line, and a layer constituting said control gate also constitutes a word line.

3. A semiconductor memory device as set forth in claim 1, wherein said first layer and said second layer comprises materials having mutually different etching rates.

4. A semiconductor memory device as set forth in claim 1, wherein said first layer comprises titanium nitride.

5. A semiconductor memory device as set forth in claim 1, wherein said second layer comprises insulating material.

6. A semiconductor memory device as set forth in claim 1, wherein said second layer comprises an oxide.

7. A semiconductor memory device as set forth in claim 1, wherein said second layer comprises metal or metal compound.

8. A semiconductor memory device as set forth in claim 1, wherein said second layer comprises tungsten.

9. A semiconductor memory device as set forth in claim 1, wherein the height of the top portion of said first layer is lower than the height of the top surface of said floating gate.

10. A semiconductor memory device as set forth in claim 1, wherein the height of the top portion of said second layer is lower than the height of the top surface of said floating gate.

11. A semiconductor memory device as set forth in claim 1, wherein the height of the top surface of said third layer is substantially the same as the height of the top surface of said floating gate.

12. A semiconductor memory device as set forth in claim 1, wherein on said element isolation regions are formed dummy floating gates.

13. A semiconductor memory device comprising:

a semiconductor substrate;

element isolation regions formed in said semiconductor substrate;

active regions between said element isolation regions;

buried diffusion layers each constituting at least a drain region or a source region;

floating gates each formed on a channel region between said drain region and said source region via an insulating film;

sidewall spacers formed on side surfaces of said floating gates and made of insulating material;

a first layer formed on said buried diffusion layers and said sidewall spacers and comprising high refractory metal or metal compound, wherein the height of the top portion of said first layer is lower than the height of the top surface of said floating gate;

a second layer formed on said first layer and made of material different from that of said first layer, wherein the height of the top portion of said second layer is lower than the height of the top surface of said floating gate;

an insulating layer formed on said second layer and said floating gate; and a control gate formed on said insulating layer.

14. A semiconductor memory device as set forth in claim 13, wherein said insulating layer has substantially flat top surface.

15. A semiconductor memory device as set forth in claim 13, wherein said insulating layer comprises a third layer formed on said second layer and a fourth layer formed on said floating gate and said third layer.

* * * * *